United States Patent
Martin et al.

(10) Patent No.: US 7,692,517 B2
(45) Date of Patent: Apr. 6, 2010

(54) OSCILLATOR WITH ACOUSTIC SURFACE WAVE RESONATORS

(75) Inventors: Guenter Martin, Dresden (DE); Manfred Weihnacht, Malter (DE)

(73) Assignee: Tele Filter GmbH, Teltow (DE)

( * ) Notice: Subject to any disclaimer, the term of this patent is extended or adjusted under 35 U.S.C. 154(b) by 451 days.

(21) Appl. No.: 11/360,634

(22) PCT Filed: Aug. 24, 2004

(86) PCT No.: PCT/EP2004/051890

§ 371 (c)(1), (2), (4) Date: Apr. 27, 2006

(87) PCT Pub. No.: WO2005/041403

PCT Pub. Date: May 6, 2005

(65) Prior Publication Data

US 2006/0202782 A1    Sep. 14, 2006

(30) Foreign Application Priority Data

Aug. 25, 2003  (DE) ................. 103 39 865
Jun. 4, 2004    (DE) ....................... 10 2004 028 421

(51) Int. Cl.
*H03H 9/00*     (2006.01)
*H03H 9/205*    (2006.01)
*H01L 41/18*    (2006.01)

(52) U.S. Cl. ........................ 333/195; 333/133
(58) Field of Classification Search ................. 333/195, 333/193, 133; 331/107 A
See application file for complete search history.

(56) References Cited

U.S. PATENT DOCUMENTS 3,701,147 A    10/1972   Whitehouse (Continued)

FOREIGN PATENT DOCUMENTS

DE    198 18 826    11/1999

OTHER PUBLICATIONS

J. F. Dias, et al., "The temperature coefficient of delay-time for X propagating accoustic surface-wave on rotated Y-cuts of alpha quartz", IEEE Trans SU-22 (1975), pp. 46-50.

(Continued)

*Primary Examiner*—Dean O Takaoka
(74) *Attorney, Agent, or Firm*—Jordan & Hamburg LLP

(57) ABSTRACT

An oscillator or a sensor comprising a unit including two frequency determining elements each of which comprises at least one interdigital converter for acoustic surface waves and a back-coupling circuit comprising an amplifier, wherein the frequency determining elements are distinguished by a temperature dependence of a synchronous frequency. The frequency determining elements are embodied in the form of acoustic surface wave resonators, and the temperature coefficients of n-th order of the synchronous frequency of the two acoustic surface wave resonators have different sings if they are not equal to zero and the temperature coefficients of (n+1st) order of the synchronous frequency of the two acoustic surface wave resonators have the same sign and the temperature coefficients from the first order to (n-1st) order of the synchronous frequency of the two acoustic surface wave resonators are equal to zero if n is greater than 1, wherein n being equal to or greater than 1, c) the ratio between the converter openings and the ratio between the lengths in the direction perpendicular to the edge teeth of the converter and to strips of the object reflectors having different frequency determining elements which are assembled in one unit are selected in such a way that the oscillator frequency variation is minimum within the range of given temperatures.

77 Claims, 3 Drawing Sheets

U.S. PATENT DOCUMENTS 3,886,484 A 5/1975 Fleming et al.
3,889,205 A 6/1975 Mitchell
3,894,286 A 7/1975 Armstrong
4,193,045 A 3/1980 Kouji et al.
4,272,742 A 6/1981 Lewis

OTHER PUBLICATIONS

S. Kanna et al., "Temperature stability of surface accoustic wave resonators on the in-plane rotated 33° Y-cut quartz", Proc. 2002 IEEE Ulstrasonics Symp., pp. 101-104.

Y. Shimizu et al., "SAW propagation characteristics of complete cut or quartz and new cuts with zero temperature coefficient of delay", Proc. 1980 IEEE Ultrasonics Symp., pp. 420-423.

OSCILLATOR WITH ACOUSTIC SURFACE WAVE RESONATORS

BACKGROUND OF THE INVENTION

The invention relates to the field of electrical engineering and electronics. Objects, for which the application is possible and appropriate, are components based on acoustic surface waves, such as oscillators and sensors, especially those sensors, for which the variation in the temperature of the oscillator frequency can be adjusted.

Oscillators are known, which comprise a composite of two frequency-determining elements, of which each element contains at least one interdigital converter for acoustic surface waves and a feedback from the output to the input of the composite containing an amplifier, the frequency-determining elements differing from one another due to the temperature dependence of the synchronous frequency.

In the case of a special embodiment, the composite of two frequency-determining elements contains two delay leads, the substrates of which belong to one and the same crystalline section, but use different splitting directions (T. J. Browning and M. F. Lewis, "A novel technique for improving the temperature stability of SAW/SSBW devices" in Proc. 1978 IEEE Ultrasonics Symposium, pages 474 to 474 (1)). The ST section of quartz serves as crystalline section. In the case of the ST section, the section normal is inclined at an angle of 42.75° to the crystallographic Y axis of quartz. The substrate of the main delay lead has the X axis of quartz as the spreading direction, while the spreading direction of the auxiliary delay lead is inclined at an angle of 41° thereto. Accordingly, in the case of the main delay lead, the temperature coefficient of the synchronous frequency of the first order disappears. On the other hand, the temperature coefficient of the synchronous frequency of the first order of the auxiliary delay lead is not equal to zero. In spite of the different orders of the temperature coefficients, it is possible to compensate for the temperature coefficient of the synchronous frequency of second order of the main delay lead. The temperature coefficient of the synchronous frequency of first order of the auxiliary delay lead, required for compensating for the temperature coefficient of the synchronous frequency of second order of the main delay lead, is given as a function of the temperature coefficient of second order, which is to be compensated, of the amplitude of the auxiliary delay lead and of the spreading segment, which is the same for the two delay leads.

In connection with sensors, which can be polled remotely and contain, in the special case, single gate resonators based on acoustic surface waves, it is known that, for temperature, compensation, two single gate resonators may be combined, the substrates of which represent different splitting directions of one and the same crystalline section (A differential measurement SAW device for passive remove sensoring, W. Buff, M. Rusko, T. Vandahl, M. Goroll and F. Möller, Proc. 1996 IEEE Ultrasonics Symposium, pages 343 to 346 (2)). In this connection, it is a prerequisite for the temperature compensation that the spreading directions have different phase velocities and almost the same temperature coefficients of the synchronous frequency.

The solution, described in the publication (1), has the following disadvantages:

1) The phase slope of the delay leads of specified substrate length may be too small, so that the oscillators are insufficiently stable.
2) The size $|S_{21}|$ at the oscillator frequency, which sets in as a function of temperature, depends too much on the temperature, so that the amplifier in the feedback, as a result of an excessively large amplification range, causes undesirable, nonlinear effects or, as a controlled amplifier, excessively high costs.
3) The method of temperature compensation from (1) can be used only for broadband frequency-determining elements.
4) The model for describing the composite of two delay leads, used in (1), is an approximation for the case that the input and output impedance of the composite of the delay leads is very large in comparison to the source or load resistance and all converters are reflection-free. The teachings, obtained with the help of this model, for example, the above-mentioned function for the temperature coefficient of the synchronous frequency of first order of the auxiliary delay lead, is therefore in many cases not applicable and cannot be transferred to those frequency-determining elements, for which reflections play an important role.

SUMMARY OF THE INVENTION

It is an object of the present invention to change temperature-stable oscillators with acoustic surface wave components as frequency-determining elements of the known type in such a manner that the phase slope of the frequency-determining elements at the specified substrate length and, accordingly, the stability of the oscillators is increased, the size $|S_{21}|$ at the oscillator frequency, which sets in at the respective temperature, is only slightly temperature-dependent the frequency-determining elements are narrow-band and teach the configuration of temperature-stable oscillators, which are not based on an approximation as in the publication (1) and can also be transferred to those frequency-determining elements, for which reflections play an important role.

This objective is accomplished owing to the fact that a) the frequency-determining elements are acoustic surface wave resonators,
b) the temperature coefficient of the $n^{th}$ order of the synchronous frequency of the two surface wave resonators have different algebraic signs, if these are not equal to zero, and the temperature coefficients of the $(n-1)^{th}$ order of the synchronous frequency of the two surface wave resonators have the same algebraic sign and the temperature coefficients of the first order to the $(n-1)^{th}$ order of the synchronous frequency of the two surface wave resonators are equal to zero if n is larger than 1, wherein the foregoing n is equal to or larger than 1,
c) the ratio of the apertures of the converters and the ratio of the lengths in the directions perpendicular to the edge of the teeth of the converters and the lengths in the direction perpendicular to the strips of the reflectors of those objects of different frequency-determining elements, which are connected with one another as a result of the composite, are selected so that the variation in the oscillator frequency is a minimum in the given temperature range.

Advisably, each of the frequency-determining elements may contain two interdigital converters for acoustic surface waves, interdigital converters being those objects, which are connected with one another in parallel as a result of the composite.

Moreover, the frequency-determining elements may be acoustic two-gate surface wave resonators, for which in each case two interdigital converters are disposed between two reflectors and the two-gate surface wave resonators differ due to the aperture and the space between the interdigital converters, the apertures, the space between the interdigital converters and the synchronous wavelengths in the two-gate surface wave resonators being selected so that the oscillator frequency at a specified temperature corresponds to a specified frequency.

Advantageously, the frequency-determining elements may be acoustic surface wave resonators, for which the interdigital converter is disposed between two reflectors. The surface wave resonators contain coupling elements here, with the help of which mutual coupling between the wave fields of the surface wave resonators is brought about. The radio of the apertures of the converters and the ratio of the lengths of the coupling elements in the direction perpendicular to the edges of the teeth of the converters and to the strips of the reflectors are selected so that the variation in the oscillator frequency is a minimum in the given temperature range.

Pursuant to the invention, both surface wave resonators may be constructed with substrates of the same type of crystal or the substrates of the surface wave resonators belong to different types of crystals. In the case of substrates of the same type of crystals, the surface wave resonators utilize different spreading directions for acoustic surface waves on one and the same crystalline section. In the case of different types of crystals, the surface wave resonators are disposed on separate substrates.

The electrode structures of both surface wave resonators may advantageously also be disposed on a common substrate.

The types of crystals, the crystalline sections as well as the spreading directions of the two-gate surface wave resonators for acoustic surface waves advantageously are selected so that the temperature dependences $f_1(T)$ and $f_2(T)$ of the synchronous frequency $f_1$ or $f_2$ of the first or second two-gate surface wave resonator respectively fulfill the equation $$V(f_1(T), f_2(T)) = -(\partial \Phi / \partial f_2)/(\partial \Phi / \partial f_1)$$

with $$V = (df_1/dT)/(df_2/dT)|_{T=T_1}$$

or with $$V = [(f_{1,max} - f_{1,min})/\Delta T_1]/[f_{2,max} - f_{2,min})/\Delta T_2]$$

and with $$\Delta T_{1,2} = T_{1,2,max} - T_{1,2,}$$

$\Phi$ being the phase of the composite of the two-gate surface wave resonator resonators, $f_{1,2,max}$ the maximum synchronous frequency of the first or the second two-gate surface wave resonators respectively in the temperature range under consideration, $f_{1,2,min}$ the minimum synchronous frequency of the first and second two-gate surface wave resonators respectively in the temperature range under consideration and $T_{1,2,max}$ and $T_{1,2,min}$ those temperatures, at which the corresponding extreme values of the synchronous frequencies occur and $T_1$ being a temperature in the temperature range under consideration.

An intermediate reflector may be disposed between the interdigital converters of at least one two-gate surface wave resonator.

One of the interdigital converters may differ from the other advisably due to its polarity.

Advantageously, the temperature coefficient of the synchronous frequency of the same order and, moreover, the temperature coefficient of the synchronous frequency of the first or second order should dominate in the two-gate surface wave resonators.

The temperature dependences of the synchronous frequency of the two-gate surface wave resonators should be similar, the similarity consisting therein that the temperature dependence of the synchronous frequency of the one two-gate surface wave resonator can be approximated by multiplication with a constant factor of the temperature dependence of the synchronous frequency of the respectively other two-gate surface wave resonator, so that the difference in the temperature dependences of the synchronous frequency in the whole of the temperature range under consideration is significantly smaller than the temperature dependence of each of the two two-gate surface wave resonators.

The synchronous wavelengths in the two-gate surface wave resonators are selected so that the two-gate surface wave resonators have the same resonance frequency in spite of different phase velocities.

The temperature coefficient of the first order of the synchronous frequency of each of the two surface wave resonators may be different from zero and differ in algebraic sign from this temperature coefficient of the respectively other surface wave resonator.

The temperature coefficient of the second order of the synchronous frequency of each of the two surface wave resonators may also be not equal to zero and differ in algebraic sign from this temperature coefficient of the respectively other surface wave resonator, the temperature coefficients of the first order, in relation to a specified temperature, being equal to zero.

As coupling element, the surface wave resonators may contain a coupling converter, the coupling converter of the first surface wave resonators being connected with the coupling converter of the respectively second surface wave resonators over two electrical connections.

Moreover, the apertures of the coupling converter may differ from one another and the number of teeth of the coupling converter may be the same. The number of teeth of the coupling converters may also be different from one another, if the apertures of the coupling converters are the same. Moreover, the coupling converters may contain more teeth than the converters of those surface wave resonators, to which the respective coupling converter belongs.

An inductance coil, referred to as coupling inductance coil, may be connected between the electrical connections, which connect the coupling converters of different surface wave resonators.

A capacitance, referred to as coupling capacitance, may be connected between the electrical connections, which connect the coupling converters of different surface wave resonators.

Advisably, at least one of the coupling converters may contain at least one group of consecutive teeth, which consists of an even number of teeth of the same polarity.

In accordance with an advantageous embodiment of the invention, the crystalline section is an ST section of quartz, the direction perpendicular to the teeth of the converter and to the reflective strips being inclined at an angle of between 0° and 45° to the crystallographic X axis of quartz for the one surface wave resonator and an angle of 45° to the crystallographic X axis of quartz for the other surface wave resonator.

Pursuant to the invention, the coupling elements of the two surface wave resonators may form a multi-strip coupler.

According to an appropriate embodiment of the invention, the teeth period of the converters, the strip period of the reflector strips, the distances of the converters from the coupling elements and the reflectors as well as the thickness of the electrode layer of the surface wave resonators are selected so that their resonances at a specified temperature have a specified frequency interval. Moreover, the specified frequency interval may be equal to zero.

Furthermore, an embodiment of an oscillator of the present invention includes the temperature coefficient of the synchronous frequency of second order dominates in both two-gate surface wave resonators.

A still further embodiment of the present invention includes an oscillator wherein the temperature coefficient of first order of the synchronous frequency of each of the two surface wave resonators is not equal to zero and differs in algebraic sign from this temperature coefficient of the other surface wave resonator.

The invention is explained below by means of examples.

DESCRIPTION OF THE PREFERRED EMBODIMENT

Example 1

Figure 1:
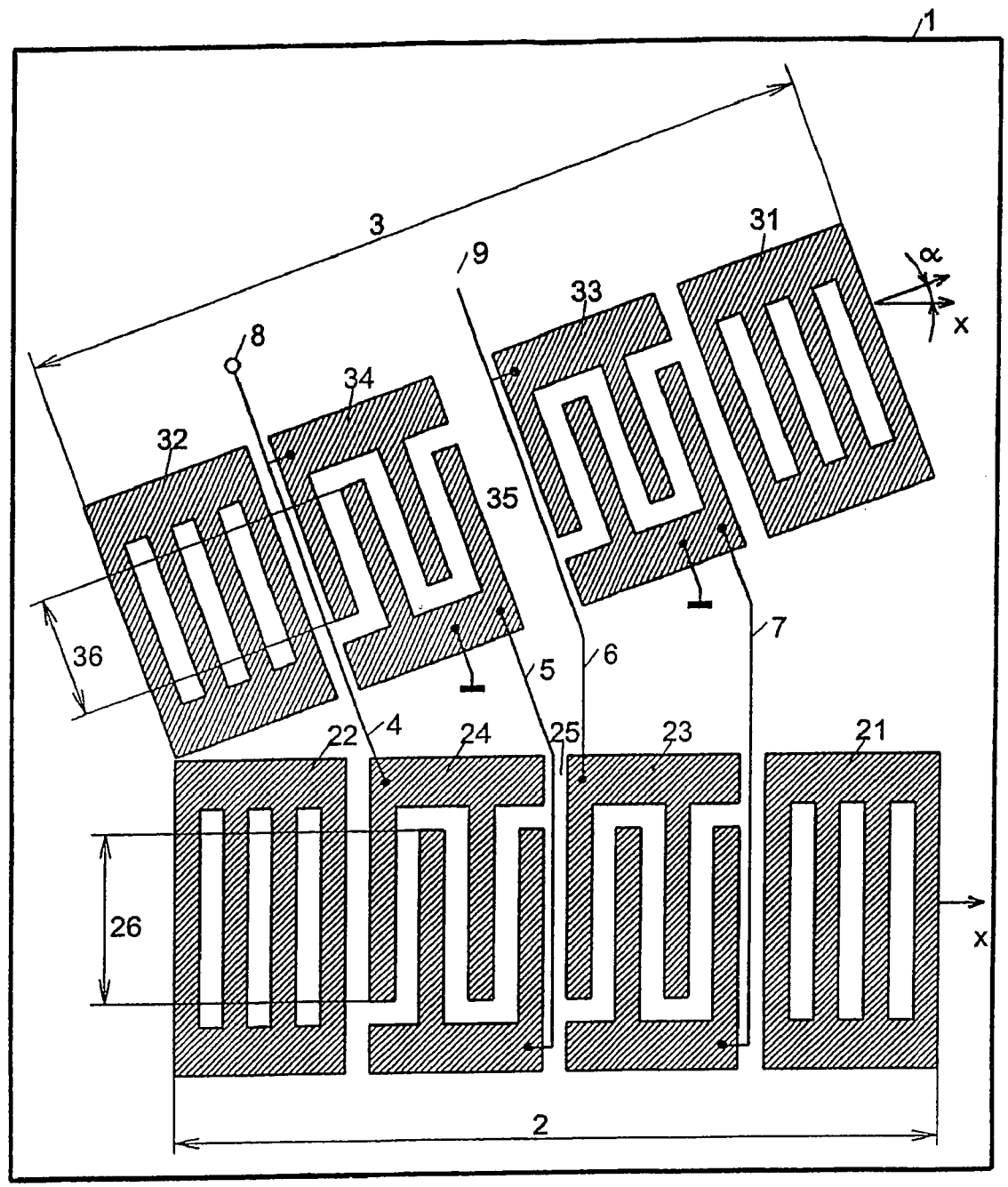
FIG. 1 shows an oscillator, consisting of a composite of two frequency-determining elements.

The oscillator, shown in FIG. 1, consists of a resonator composite as frequency-determining element and a feedback from the output to the input of the composite, which is not shown in the drawing and contains an amplifier. It is assumed that the phase of this feedback is equal to zero. The properties of the resonator composite are described in the following.

Two two-gate surface wave resonators 2; 3, assembled from reflectors 21; 22 and interdigital converters 23; 24 or from reflectors 31; 32 and interdigital converters 33; 34, are disposed on a substrate 1, which is an ST section of quartz. The two-gate surface wave resonators 2; 3 form a resonator composite. The spreading direction of the two-gate resonator 2, that is, the direction perpendicular to the teeth of the converter 23; 24 and to the strips of the reflectors 21; 22, is aligned parallel to the crystallographic x axis of quartz. For this reason, the temperature dependence of the synchronous frequency of the two-gate surface wave resonator 2 has a course, in which the parabolic portion dominates. The spreading direction of the two-gate surface wave resonator 3, that is, the direction perpendicular to the teeth of the converters 33; 34 and to the strips of the reflectors 31; 32, is inclined at an angle α to the crystallographic x axis of quartz. The course of the temperature dependence of the synchronous frequency of the two-gate surface wave resonator 3 is also dominated by the parabolic portion. The converter 23 of the two-gate surface wave resonator 2 and the converter 33 of the two-gate surface wave resonator 3 are connected in parallel over the electrical connections 6; 7, while the converter 24 of the two-gate surface wave resonator 2 and the converter 34 of the two-gate surface wave resonator 3 are connected in parallel over the electrical connections 4; 5. The distance between the centers of adjacent teeth and the distance between the centers of adjacent reflector strips, corresponding to half the synchronous wave length, are selected in the two-gate surface wave resonators 2; 3 so that, in each case, a resonance frequency of both two-gate surface wave resonators 2; 3 lies at the same frequency. The connection in parallel of the converters 24; 34 and 23; 33 forms the input 8 and output 9 respectively of the resonator composite. A space 35 between the converters 33 and 34 of the two-gate surface wave resonator 3 is larger than the space 25 between the converters 23 and 24 of the two-gate surface wave resonator 2 and the apertures 36 of the converters 33 and 34 of the two-gate surface wave resonator 3 is smaller than the aperture 26 of the converters 23 and 24 of the two-gate surface wave resonator 2.

To begin with, for the determination of the parameters of the two-gate surface wave resonators 2; 3, the space 25, the aperture 26 and the synchronous frequency of the two-gate surface wave resonator 2, as well as the space 35 and the synchronous frequency of the two-gate surface wave resonator 3 are set. From the requirement that the phase of the resonator composite must be equal to zero, the aperture 36 is determined with the help of zero search program. Utilizing all these quantities and the requirement that the derivative of the oscillator frequency as a function of temperature shall disappear at a specified temperature, the ratio V of the temperature derivatives of the synchronous frequency of the two-gate surface wave resonators 2; 3 is calculated from the ratio of the derivatives of the phase of the resonator composite as a function of the synchronous frequency of the two-gate surface wave resonator 2 and 3 according to the equation $$V = (df_1/dT)/(df_2/dT)|_{T=T_1} = -(\partial \phi/\partial f_2)/(\partial \phi/\partial f_1)$$

$f_1$, $f_2$ being the synchronous frequency of the two-gate surface wave resonators 2 and 3 and $T_1$ being a specified temperature.

If the ratio V does not agree with the ratio $V_0$, at least one of the quantities comprising the space 25, the aperture 26, the synchronous frequency of the two-gate surface wave resonator 2, the space 35 and the synchronous frequency of the two-gate surface wave resonator 3 is varied and, subsequently, the aperture 36 is determined once again. In this connection, $V_0$ is the ratio of the derivatives of the temperature dependence of the synchronous frequency, existing as experimental or calculated data, for the spreading directions of the two-gate surface wave resonators 2:3. This method is repeated until agreement between the ratio V and the ratio $V_0$ within a specified error range is attained. As a result of this method, all parameters are known, so that the oscillator frequency is less temperature dependent, when the resonator composite is used instead of a two-gate resonator on the basis of acoustic surface waves as a frequency-determining element of an oscillator.

Example 2

Figure 2:
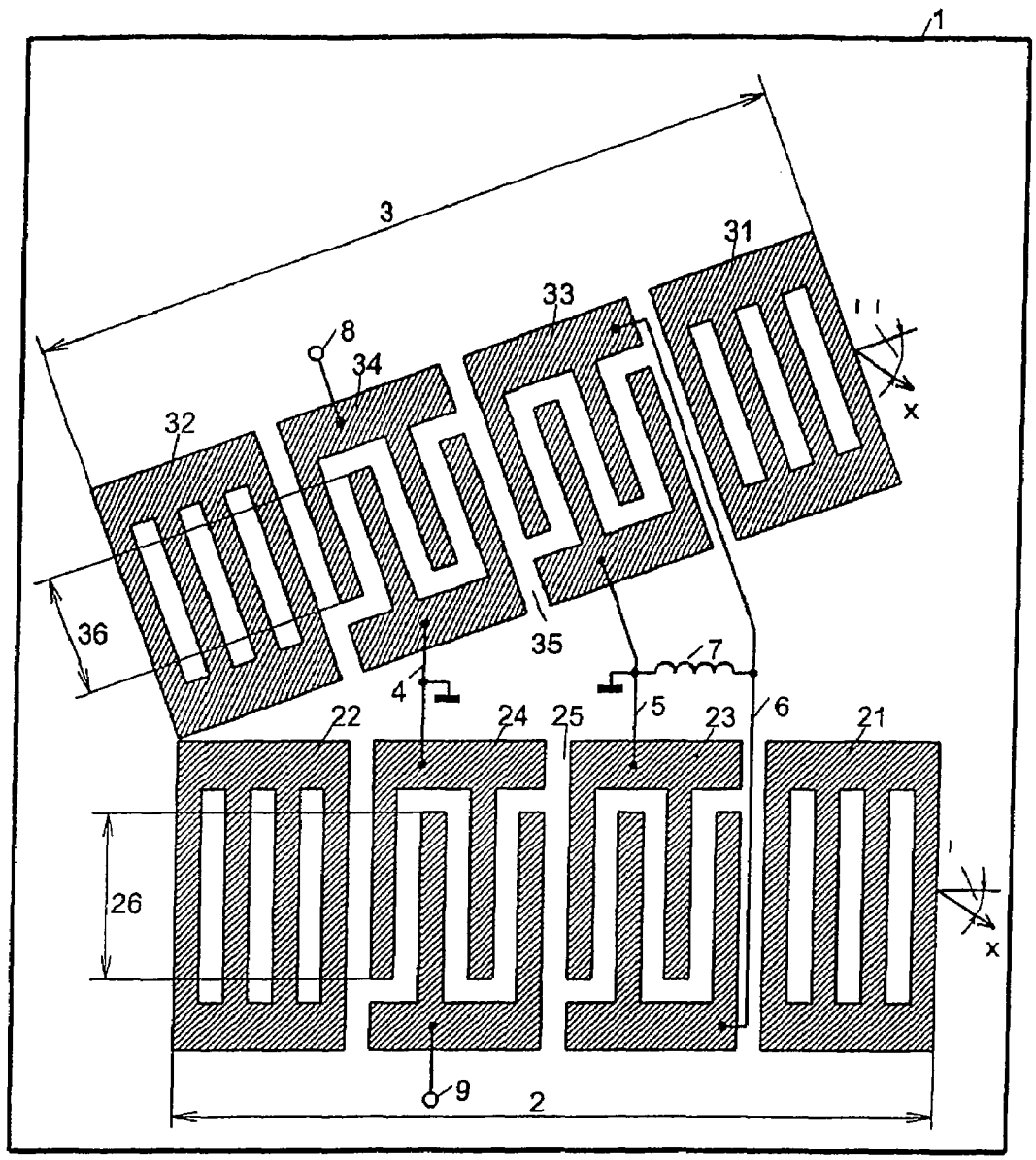
FIG. 2 shows a further oscillator with two frequency-determining elements and a coupling inductance coil.

This example relates to the oscillator shown in FIG. 2. This oscillator consists of a resonator composite as frequency determining element and a feedback from the output to the input of the composite. The feedback contains an amplifier and is not shown. It is assumed that the phase of this feedback is equal to zero. The properties of this resonator composite are described in the following.

On a substrate 1, which is an ST section of quartz, the surface wave resonators 2; 3, assembled from the reflectors 21; 22 and the interdigital converter 24 and from the reflectors 31; 32 and the interdigital converter 34, are disposed. In addition, a coupling converter 23 or 33 is disposed in the surface wave resonator 2 or 3 between the converter 24 or 34 and the reflector 21 or 31. The surface wave resonators 2; 3 form a resonator composite. The electrodes consist of a layer of aluminum 300 nm thick. The spreading direction of the surface wave resonator 2, that is, the direction perpendicular to the teeth of the coupling converter 23 and of the converter 24 and the strips of the reflectors 21; 22, is inclined at an angle α2 of 30° to the crystallographic x axis of quartz. For this reason, the temperature coefficient of first order of the synchronous frequency of the surface wave resonator 2 is positive. The spreading direction of the surface wave resonator 3, that is, the direction perpendicular to the teeth of the coupling converter 33 and of the converter 34 and of the strips of the reflectors 31; 32, is inclined at an angle α3 of 47.5° to the crystallographic x axis of quartz. For this reason, the temperature coefficient of first order of the synchronous frequency of the surface wave resonator 3 is negative. The spaces 25 and 35 between the converter 24 and the coupling converter 23 of the surface wave resonator 2 or between the converter 34 and the coupling converter 33 of the surface wave resonators 3 have the same width. In each case, a comb-shaped electrode of the converter 24 and of the converter 34 are in electrical contact with one another over the connection 4 at ground potential. Each comb-shaped electrode of the coupling converter 23 is in electrical connection with a comb-shaped electrode of the coupling converter 23 over the connections 5 and 6, the connection 5 being connected to the ground potential. A coupling inductance coil 7 is connected between the connections 5 and 6. Together with the capacitances of the coupling converters 23 and 33, it forms an oscillator circuit. The converter 34 of the surface wave resonator 3 serves as input 8 and the converter 24 of the surface wave resonator 2 serves as output 9 of the resonator composite. The apertures 26 and 36 of the coupling converter 23 and of the converter 24 or of the coupling converter 33 and the converter 34 as well as the coupling conductance 7 are selected so that the variation in the oscillator frequency is a minimum in the temperature range given. A distance between centers of adjacent teeth, a distance between centers of adjacent reflector strips, the spaces 25 and 35 between the coupling converter 23 and the converter 24 or between the coupling converter 33 and the converter 34 and the spaces between the coupling converter 23 and the reflector 21, between the converter 24 and the reflector 22, between the coupling converter 33 and the reflector 31 as well as between the converter 34 and the reflector 32 in the surface wave resonators 2; 3 are selected so that in each case a resonance of the two surface wave resonators 2; 3 is at the same frequency at room temperature.

The oscillator oscillates at a resonance of that resonance pair, which results from the coupling of the resonances of the surface wave resonators 2 and 3 belonging to the respective symmetrical cavity mode. This coupling is produced by the connections 5 and 6. The resonance, which belongs to the symmetrical coupling mode, is selected as the resonance of the aforementioned resonance pair. This coupling mode is characterized by in-phase electrical signals of the coupling converters 23 and 33.

Example 3

Figure 3:
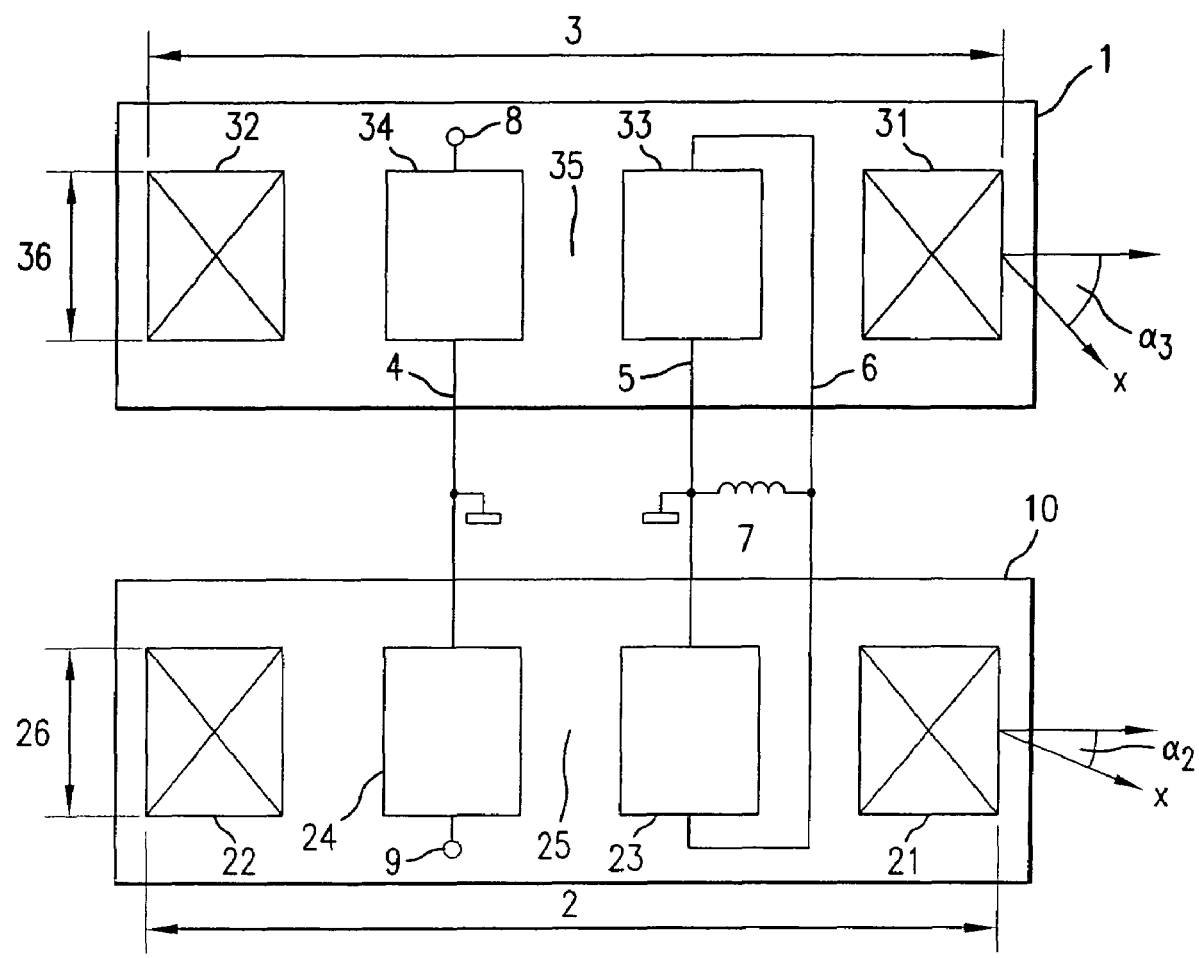
FIG. 3 shows a further oscillator with two frequency-determining elements, which are disposed here on separate substrates.

This example relates to the oscillator with two separate substrates, which is shown in FIG. 3. A surface wave resonator 2, assembled from the reflectors 21; 22 and the interdigital converter 34, is disposed here on a first substrate 10. In addition, a coupling converter 23 is disposed in the surface wave resonator 2 between the converter 24 and the reflector 21. A surface wave resonator 3, assembled from the reflectors 31; 32 and the interdigital converter 34, is disposed on a second substrate 1. In addition, a coupling converter 33 is disposed in the surface wave resonator 3 between the converter 34 and the reflector 31. The surface wave resonators 2; 3 form a resonator composite. The substrate 1 as well as the substrate 10 is an ST section of quartz. In this case, a spreading direction of the surface wave resonator 2, that is, the direction perpendicular to the teeth of the coupling converter 23 and of the converter 24 and to the strips of the reflector 21; 22, is inclined at an angle α2 of 30° to the crystallographic x axis of quartz. For this reason, a temperature coefficient of first order of the synchronous frequency of the surface wave resonator 2 is positive. A spreading direction of the surface wave resonator 3, that is, a direction perpendicular to the teeth of the coupling converter 33 and of the converter 34 and to the strips of the reflectors 31; 32, is inclined at an angle α3 of 47.5° to the crystallographic x axis of the substrate 10. For this reason, the temperature coefficient of first order of the synchronous frequency of the surface wave resonator 3 is negative.

However, the substrates 1 and 10 may also be sections of crystals of different types.

The spaces 25 and 35 between the converter 24 and the coupling converter 23 of the surface wave resonator 3 or between the converter 34 and the coupling converter 33 of the surface wave resonator 3 are equal in width. In each case, a comb-like electrode of the converter 24 and of the converter 34 contact one another electrically over the connection 4 at ground potential. Each comb-like electrode of the coupling converter 23 is in electrical connection with a comb-like electrode of the coupling converter 33 over the connections 5 and 6, the connection 5 being connected to the ground potential. A coupling inductance coil 7 is connected between the connections 5 and 6 and, together with the capacitances of the coupling converters 23 and 33, forms an oscillating circuit. The converter 34 of the surface wave resonator 3 serves as input 8 and the converter 24 of the surface wave resonator 2 serves as output 9 of the resonator composite. The apertures 26 and 36 of the coupling converter 23 and of the converter 24 or of the coupling converter 33 and of the converter 34, as well as the coupling inductance coil 7 are selected so that the variation of the oscillator frequency in the given temperature range is minimal. The distance between the centers of adjacent teeth, the distance between the centers of adjacent reflector strips, the spaces 25 and 35 between the coupling converter 23 and the converter 24 or between the coupling converter 33 and the converter 34 and the spaces between the coupling converter 23 and the reflector 21, between the converter 24 and the reflector 22, between the coupling converter 33 and the reflector 31 as well as between the reflector 34 and the reflector 32 in the surface wave resonators 2; 3 are selected so that, in each case, a resonance of the two surface wave resonators 2; 3 is at the same frequency at room temperature.

The invention claimed is:

1. An oscillator comprising a composite of two frequency-determining elements, each element comprising at least one interdigital converter for acoustic surface waves, a feedback from an output to an input of the composite including an amplifier, and the frequency-determining elements differing from one another due to a temperature dependence of the synchronous frequency wherein:
   a) the frequency-determining elements are first and second acoustic surface wave resonators;
   b) first-order temperature coefficients of the synchronous frequencies of the two surface wave resonators have different algebraic signs and second-order temperature coefficients of the synchronous frequencies of the two surface wave resonators have the same algebraic sign, or the second-order temperature coefficients of the synchronous frequency of the two surface acoustic wave resonators have the same sign and the first-order temperature coefficients for the synchronous frequencies of the two surface acoustic wave resonators are equal to zero; and c) a ratio of an aperture of the of the first surface acoustic wave resonator to an aperture of the converter for the second surface acoustic wave resonator and a ratio of a number teeth of the converter of the first surface acoustic wave resonator to a number of teeth of the converter of the second surface acoustic wave resonator are selected so that variation in an oscillator frequency of the oscillator is a minimum in a given temperature range, and wherein:

the surface wave resonators comprise a coupling converter as a coupling element and the coupling converters of the first surface wave resonator are connected with the coupling converters of the second surface wave resonator over two electrical connections; and the number of teeth of the coupling converters differ from one another and the apertures of the coupling converters are the same.

2. The oscillator of claim 1, wherein each of the frequency determining elements comprises two interdigital converters for acoustic surface waves, the interdigital converters being, as a result of the composite, connected in parallel with one another.

3. The oscillator of claim 2, wherein the frequency-determining elements are acoustic two-gate surface wave resonators, for which in each case two-interdigital converters are disposed between two reflectors and the two-gate surface wave resonators differ due to the spaces between the interdigital converters and the synchronous wavelengths in the two-gate surface wave resonators being selected so that the oscillator frequency corresponds to a specified frequency at a specified temperature.

4. The oscillator of claim 1, wherein the frequency-determining elements are acoustic surface wave resonators, for which the interdigital converters are each disposed between two reflectors and that the surface wave resonators comprise coupling elements effecting mutual coupling of wave fields of the surface wave resonators and the ratio of number of the teeth of the coupling elements in the direction perpendicular to the edges of the teeth of the converter and perpendicular to reflectors strips of the reflectors are selected so that the variation in the oscillator frequency is a minimum in the given temperature range.

5. The oscillator of claim 1, wherein both surface wave resonators are built up with substrates of a same type of crystal.

6. The oscillator of claim 1, wherein the substrates of the surface wave resonators belong to different types of crystal.

7. The oscillator of claim 5, wherein the surface wave resonators use different spreading directions for acoustic surface waves on a same crystalline section.

8. The oscillator of claims 1 or 6, wherein the surface wave resonators are disposed on separate substrates.

9. The oscillator of claim 1, wherein electrode structures of the two surface wave resonators are disposed on a common substrate.

10. The oscillator of claim 3, wherein types of crystal, crystalline sections as well as spreading directions of the two-gate surface wave resonators for acoustic surface waves are selected so that temperature dependencies $f_1(T)$ and $f_2(T)$ of the synchronous frequencies $f_1$ and $f_2$ respectively of the first or second two-gate surface wave resonator satisfy the equation:

$$V(f_1(T), f_2(T)) = -(\partial \Phi / \partial f_2)/(\partial \rho / \partial f_1)$$

with $$V = (df_1/dT)/(df_2/dT)|_{T=T_1}$$

or with $$V = [(f_{1,max} - f_{1,min})/\Delta T_1]/[(f_{2,max} - f_{2,min})/\Delta T_2]$$

and with $$\Delta T_{1,2} = T_{1,2,max} - T_{1,2,min}$$

$\Phi$ being the phase of the composite of the two-gate surface wave resonator resonators, $f_{1,2,max}$ being a maximum synchronous frequency of the first or the second two-gate surface wave resonators respectively in the temperature range under consideration, $f_{1,2,min}$ being a minimum synchronous frequency of the first and second two-gate surface wave resonators respectively in the temperature range under consideration and $T_{1,2,max}$ and $T_{1,2,min}$ being respective maximum and minimum temperatures at which the corresponding extreme values of the synchronous frequencies occur and $T_1$ being a temperature in the temperature range under consideration.

11. The oscillator of claim 3, wherein one of the interdigital converters differs from remaining ones due to a polarity thereof.

12. The oscillator of claim 3, wherein the temperature coefficient of the synchronous frequency of the same order dominates in both two-gate surface wave resonators.

13. The oscillator of claim 12, wherein the temperature coefficient of the synchronous frequency or first order dominates in both two-gate surface wave resonators.

14. The oscillator of claim 12, wherein the temperature coefficient of the synchronous frequency of second order dominates in both two-gate surface wave resonators.

15. The oscillator of claim 3, wherein the temperature dependencies of the synchronous frequencies of the two-gate surface wave resonators are similar, the similarity comprising therein that the temperature dependence of the synchronous frequency of the one two-gate surface wave resonator can be approximated by multiplication with a constant factor of the temperature dependence of the synchronous frequency of the respectively other two-gate surface wave resonator, so that the difference in the temperature dependencies of the synchronous frequency in a whole of the temperature range under consideration is significantly smaller than this temperature range each of the two two-gate surface wave resonators.

16. The oscillator of claim 3, wherein the synchronous wavelengths in the two-gate surface wave resonators are selected so that the two-gate surface wave resonators have the same resonance frequency in spite of different phase velocities.

17. The oscillator of claim 1, wherein the temperature coefficient of first order of the synchronous frequency of each of the two surface wave resonators is not equal to zero and differs in algebraic sign from this temperature coefficient of the other surface wave resonator.

18. The oscillator of claim 1, wherein the temperature coefficient of second order of the synchronous frequency of each of the two surface wave resonators is not equal to zero and have a same algebraic sign, and the temperature coefficients of first order, in relation to a specified temperature, being equal to zero.

19. The oscillator of claim 1, wherein the coupling converters contain more teeth than the coupling converters of those surface wave resonators, to which the respective coupling converter belongs.

20. The oscillator of claim 1, wherein an inductance coil is connected between the electrical connections which connect the coupling converters of different ones of the surface wave resonators.

21. The oscillator of claim 1, wherein a capacitance is connected between the electrical connections, which connect the coupling converters of different one of the surface wave resonators.

22. The oscillator of claim 1, wherein at least one of the coupling converters comprises at least one group of consecutive teeth, which comprises of an even number of teeth having the same polarity.

23. The oscillator of one of claims, 3 or 4 wherein a crystalline section on which the two surface wave resonators are constructed is an ST section of quartz and that the direction perpendicular to the teeth of the converters and to the reflector strips is inclined to the crystallographic x axis of quartz at an angle between 0° and 45° for the one surface wave resonator and at an angle greater than 45° for the other surface wave resonator.

24. The oscillator of one of the claims 4, 7 and 9, wherein the coupling elements of both surface wave resonators form a multi-strip coupler.

25. The oscillator of claim 4, wherein a teeth period of the converters, a strip period of the reflector strips, distances between the converters and the coupling elements and between the converters and the reflectors, as well as the thickness of the electrode layer of the surface wave resonators are selected so that their resonances have a specified frequency interval at a specified temperature.

26. The oscillator of claim 25, wherein the specified frequency interval is equal to zero.

27. An oscillator comprising a composite of two frequency-determining elements, each element comprising at least one interdigital converter for acoustic surface waves, a feedback from an output to an input of the composite including an amplifier, and the frequency-determining elements differing from one another due to a temperature dependence of the synchronous frequency wherein:

a) the frequency-determining elements are first and second acoustic surface wave resonators;

b) first-order temperature coefficients of the synchronous frequencies of the two surface wave resonators have different algebraic signs and second-order temperature coefficients of the synchronous frequencies of the two surface wave resonators have the same algebraic sign, or the second-order temperature coefficients of the synchronous frequency of the two surface acoustic wave resonators have the same sign and the first-order temperature coefficients for the synchronous frequencies of the two surface acoustic wave resonators are equal to zero; and c) a ratio of an aperture of the converter of the first surface acoustic wave resonator to an aperture of the converter for the second surface acoustic wave resonator and a ratio of a number teeth of the converter of the first surface acoustic wave resonator to a number of teeth of the converter of the second surface acoustic wave resonator are selected so that variation in an oscillator frequency of the oscillator is a minimum in a given temperature range, and wherein:

each of the frequency determining elements comprises two interdigital converters for acoustic surface waves, the interdigital converters being, as a result of the composite, connected in parallel with one another:

the frequency-determining elements are acoustic two-gate surface wave resonators, for which in each case two-interdigital converters are disposed between two reflectors and the two-gate surface wave resonators differ due to the aperture and the space between the interdigital converters, the apertures, the spaces between the interdigital converters and the synchronous wavelengths in the two-gate surface wave resonators being selected so that the oscillator frequency corresponds to a specified frequency at a specified temperature; and the number of teeth of the interdigital converters differ from one another and the apertures of the interdigital converters are the same.

28. The oscillator of claim 27, wherein the frequency-determining elements are acoustic surface wave resonators, for which the interdigital converters are each disposed between two reflectors and that the surface wave resonators comprise coupling elements effecting mutual coupling of wave fields of the surface wave resonators and the ratio of number of the teeth of the coupling elements in the direction perpendicular to the edges of the teeth of the converter and perpendicular to reflector strips of the reflectors are selected so that the variation in the oscillator frequency is a minimum in the given temperature range.

29. The oscillator of claim 27, wherein both surface wave resonators are built up with substrates of a same type of crystal.

30. The oscillator of claim 27, wherein the substrates of the surface wave resonators belong to different types of crystal.

31. The oscillator of claim 29, wherein the surface wave resonators use different spreading directions for acoustic surface waves on a same crystalline section.

32. The oscillator of claim 27, wherein the surface wave resonators are disposed on separate substrates.

33. The oscillator of claim 27, wherein electrode structures of the two surface wave resonators are disposed on a common substrate.

34. The oscillator of claim 27, wherein types of crystal, crystalline sections as well as spreading directions of the two-gate surface wave resonators tor acoustic surface waves are selected so that temperature dependencies $f_1(T)$ and $f_2(T)$ of the synchronous frequencies $f_1$ and $f_2$ respectively of the first or second two-gate surface wave resonator satisfy the equation:

$$V(f_1(T), f_2(T)) = -(\partial \Phi / \partial f_2)/(\partial \rho / \partial f_1)$$

with $$V = (df_1/dT)/(df_2/dT)|_{T=T_1}$$

or with $$V = [(f_{1,max} - f_{1,min})/\Delta T_1]/[(f_{2,max} - f_{2,min})/\Delta T_2]$$

and with $$\Delta T_{1,2} = T_{1,2,max} - T_{1,2,min}$$

Φ being a phase of the composite to the two-gate surface wave resonator resonators, $f_{1,2,max}$ being a maximum synchronous frequency of the first or the second two-gate surface wave resonators respectively in the temperature range under consideration, $f_{1,2,min}$ being a minimum synchronous frequency of the first and second two-gate surface wave resonators respectively in the temperature range under consideration and $T_{1,2,max}$ and $T_{1,2,min}$ being respective maximum and minimum temperatures at which the corresponding extreme values of the synchronous frequencies occur and $T_1$ being a temperature in the temperature range under consideration.

35. The oscillator of claim 27, wherein one of the interdigital converters differs from remaining ones due to a polarity thereof.

36. The oscillator of claim 27, wherein the temperature coefficient of the synchronous frequency of the same order dominates in both two-gate surface wave resonators.

37. The oscillator of claim 36, wherein the temperature coefficient of the synchronous frequency of first order dominates in both two-gate surface wave resonators.

38. The oscillator of claim 27 wherein a crystalline section on which the two surface wave resonators are constructed is an ST section of quartz and that the direction perpendicular to the teeth of the converters and to the reflector strips is inclined to the crystallographic x axis of quartz at an angle between 0° and 45° for the one surface wave resonator and at an angle greater than 45° for the other surface wave resonator.

39. An oscillator comprising a composite of two frequency-determining elements, each element comprising at least one interdigital converter for acoustic surface waves, a feedback from an output to an input of the composite including an amplifier, and the frequency-determining elements differing from one another due to a temperature dependence of the synchronous frequency wherein:

a) the frequency-determining elements are first and second acoustic surface wave resonators;

b) first-order temperature coefficients of the synchronous frequencies of the two surfaces wave resonators have different algebraic signs and second-order temperature coefficients of the synchronous frequencies of the two surface wave resonators have the same algebraic sign, or the second-order temperature coefficients of the synchronous frequency of the two surface acoustic wave resonators have the same sign and the first-order temperature coefficients for the synchronous frequencies of the two surface acoustic wave resonators are equal to zero; and c) a ratio of an aperture of the converter of the first surface acoustic wave resonator to an aperture of the converter for the second surface acoustic; wave resonator and a ratio of a number teeth of the converter of the first surface acoustic wave resonator to a number of teeth of the converter of the second surface acoustic wave resonator are selected so that variation in an oscillator frequency of the oscillator is a minimum in a given temperature range, and wherein:

the frequency-determining elements are acoustic surface wave resonators, for which the interdigital converters are each disposed between two reflectors and that the surface wave resonators comprise coupling elements effecting mutual coupling of wave fields of the surface wave resonators and the ratio of the apertures of the converters and the ratio of number of the teeth of the coupling elements in the direction perpendicular to the edges of the teeth of the converter and perpendicular to strips of the reflectors are selected so that the variation in the oscillator frequency is a minimum in the given temperature range; and the number of teeth of the interdigital converter differ from one another and the apertures of the interdigital converters are the same.

40. The oscillator of claim 39, wherein both surface wave resonators are built up with substrates of a same type of crystal.

41. The oscillator of claim 39, wherein the substrates of the surface wave resonators belong to different types of crystal.

42. The oscillator of claim 40, wherein the surface wave resonators use different spreading directions for acoustic surface waves on a same crystalline section.

43. The oscillator of claim 39, wherein the surface wave resonators are disposed on separate substrates.

44. The oscillator of claim 39, wherein electrode structures of the two surface wave resonators are disposed on a common substrate.

45. The oscillator of claim 39, wherein the temperature coefficient of first order of the synchronous frequency of each of the two surface wave resonators is not equal to zero and differs in algebraic sign from this temperature coefficient of the other surface wave resonator.

46. The oscillator of claim 39, wherein the temperature coefficient of second order of the synchronous frequency of each of the two surface wave resonators is not equal to zero and have a same algebraic sign, and the temperature coefficients of first order, in relation to a specified temperature, being equal to zero.

47. The oscillator of claim 39, wherein the surface wave resonators comprise a coupling converter as a coupling element and the coupling converters of the first surface wave resonator are connected with the coupling converters of the respectively second surface wave resonator over two electrical connections.

48. The oscillator of claim 47, wherein an inductance coil is connected between the electrical connections which connect the coupling converters of different ones of the surface wave resonators.

49. The oscillator of claim 47, wherein a capacitance is connected between the electrical connections, which connect the coupling converters of different one of the surface wave resonators.

50. The oscillator of claim 47, wherein at least one of the coupling converters comprises at least one group of consecutive teeth, while comprises of an even number of teeth having the same polarity.

51. An oscillator comprising a composite of two frequency-determining elements, each element comprising at least one interdigital converter for acoustic surface waves, a feedback from an output to an input of the composite including an amplifier, and the frequency-determining elements differing from one another due to a temperature dependence of the synchronous frequency wherein:

a) the frequency-determining elements are first and second acoustic surface wave resonators;

b) first-order temperature coefficients of the synchronous frequencies of the two surface wave resonators have different algebraic signs and second-order temperature coefficients of the synchronous frequencies of the two surface wave resonators have the same algebraic sign, or the second-order temperature coefficients of the synchronous frequency of the two surface acoustic wave resonators have the same sign and the first-order temperature coefficients for the synchronous frequencies of the two surface acoustic wave resonators are equal to zero; and c) a ratio of an aperture of the of the first surface acoustic wave resonator to an aperture of the converter for the second surface acoustic wave resonator and a ratio of a number teeth of the converter of the first surface acoustic wave resonator to a number of teeth of the converter of the second surface acoustic wave resonator are selected so that variation in an oscillator frequency of the oscillator is a minimum in a given temperature range, and wherein:

each of the frequency determining elements comprises two interdigital converters for acoustic surface waves, the interdigital converters being, as a result of the composite, connected in parallel with one another;

the frequency-determining elements are acoustic two-gate surface wave resonators, for which in each case two-interdigital converters are disposed between two reflectors and the two-gate surface wave resonators differ due to the aperture and the space between the interdigital converters, the apertures, the spaces between the interdigital converters and the synchronous wavelengths in the two-gate surface wave resonators being selected so that the oscillator frequency corresponds to a specified frequency at a specified temperature; and a crystalline section on which the two surface wave resonators are constructed is an ST section of quartz and that the direction perpendicular to the teeth of the converters and to the reflector strips is inclined to the crystallographic x axis of quartz at an angle between 0° and 45° for the one surface wave resonator and at an angle greater than 45° for the other surface wave resonator.

52. The oscillator of claim 51, wherein the frequency-determining elements are acoustic surface wave resonators, for which the interdigital converters are each disposed between two reflectors and that the surface wave resonators comprise coupling elements effecting mutual coupling, of wave fields of the surface wave resonators and the ratio of the apertures of the converters and the ratio of number of the teeth of the coupling elements in the direction perpendicular to the edges of the teeth of the converter and perpendicular to strips of the reflectors are selected so that the variation in the oscillator frequency is a minimum in the given temperature range.

53. The oscillator of claim 51, wherein types of crystal, crystalline section as well as spreading directions of the two-gate surface wave resonators for acoustic surface waves are selected so that temperature dependencies $f_1(T)$ and $f_2(T)$ of the synchronous frequencies $f_1$ and $f_2$ respectively of the first or second two-gate surface wave resonator satisfy the equation:

$$V(f_1(T), f_2(T)) = -(\partial \Phi / \partial f_2)/(\partial \Phi / \partial f_1)$$

with $$V = (df_1/dT)/(df_2/dT)|_{T=T1}$$

or with $$V = [(f_{1,max} - f_{1,min})/\Delta T_1]/[(f_{2,max} - f_{2,min})/\Delta T_2]$$

and with $$\Delta T_{1,2} = T_{1,2,max} - T_{1,2,min}$$

Φ being a phase of the composite of the two-gate surface wave resonator resonators, $f_{1,2,max}$ being a maximum synchronous frequency of the first or the second two-gate surface wave resonators respectively in the temperature range under consideration, $f_{1,2,min}$ being a minimum synchronous frequency of the first and second two-gate surface wave resonators respectively in the temperature range under consideration and $T_{1,2,max}$ and $T_{1,2,min}$ being respective maximum and minimum temperatures at which the corresponding extreme values of the synchronous frequencies occur and $T_1$ being a temperature in the temperature range under consideration.

54. The oscillator of claim 51, wherein one of the interdigital converters differs from remaining ones due to a polarity thereof.

55. The oscillator of claim 51, wherein the temperature coefficient of the synchronous frequency of the same order dominates in both two-gate surface wave resonators.

56. The oscillator of claim 55, wherein the temperature coefficient of the synchronous frequency of first order dominates in both two-gate surface wave resonators.

57. The oscillator of claim 55, wherein the temperature coefficient of the synchronous frequency of second order dominates in both two-gate surface wave resonators.

58. The oscillator of claim 55, wherein the temperature dependencies of the synchronous frequencies of the two-gate surface wave resonators are similar, the similarity comprising therein that the temperature dependence of the synchronous frequency of the one two-gate surface wave resonator can be approximated by multiplication with a constant factor of the temperature dependence of the synchronous frequency of the respectively other two-gate surface wave resonator, so that the difference in the temperature dependencies of the synchronous frequency in a whole of the temperature range under consideration is significantly smaller than this temperature dependence of each of the two two-gate surface wave resonators.

59. The oscillator of claim 51, wherein the synchronous wavelengths in the two-gate surface wave resonators are selected so that the two-gate surface wave resonators have the same resonance frequency in spite of different phase velocities.

60. the oscillator of claim 51, wherein the temperature coefficient of first order of the synchronous frequency of each of the two surface wave resonators is not equal to zero and differs in algebraic sign from this temperature coefficient of the other surface wave resonator.

61. The oscillator of claim 51, wherein the temperature coefficient of second order of the synchronous frequency of each of the two surface wave resonators is not equal to zero and have a same algebraic sign, and the temperature coefficients of first order, in relation to a specified temperature, being equal to zero.

62. The oscillator of claim 51, wherein the surface wave resonators comprise a coupling converter as a coupling element and the coupling converters of the first surface wave resonator are connected with the coupling converters of the respectively second surface wave resonator over two electrical connections.

63. The oscillator of claim 51, wherein the apertures of the coupling converters differ from one another and the number of teeth of the coupling converters are the same.

64. The oscillator of claim 62, wherein an inductance coil is connected between the electrical connections which connect the coupling converters of different ones of the surface wave resonators.

65. The oscillator of claim 62, wherein a capacitance is connected between the electrical connections, which connect the coupling converters of different one of the surface wave resonators.

66. An oscillator comprising a composite of two frequency-determining elements, each element comprising at least one interdigital converter for acoustic surface waves, a feedback from an output to an input of the composite including an amplifier, and the frequency-determining elements differing from one another due to a temperature dependence of the synchronous frequency wherein:
  a) the frequency-determining elements are first and second acoustic surface wave resonators;
  b) first-order temperature coefficients of the synchronous frequencies of the two surface wave resonators have different algebraic signs and second-order temperature coefficients of the synchronous frequencies of the two surface wave resonators have the same algebraic sign, or the second-order temperature coefficients of the synchronous frequency of the two surface acoustic wave resonators have the same sign and the first-order temperature coefficients for the synchronous frequencies of the two surface acoustic wave resonators are equal to zero; and
  c) a ratio of an aperture of the of the first surface acoustic wave resonator to an aperture of the converter for the second surface acoustic wave resonator and a ratio of a number teeth of the converter of the first surface acoustic wave resonator to a number of teeth of the converter of the second surface acoustic wave resonator are selected so that variation in an oscillator frequency of the oscillator is a minimum in a given temperature range, and wherein:

the frequency-determining elements are acoustic surface wave resonators, for which the interdigital converters are each disposed between two reflectors and that the surface wave resonators comprise coupling elements effecting mutual coupling of wave fields of the surface wave resonators and the ratio of the apertures of the converters and the ratio of number of the teeth of the coupling elements in the direction perpendicular to the edges of the teeth of the converter and perpendicular to strips of the reflectors are selected so that the variation in the oscillator frequency is a minimum in the given temperature range; and a crystalline section on which the two surface wave resonators are constructed is an ST section of quartz and that the direction perpendicular to the teeth of the converters and to the reflector strips is inclined to the crystallographic x axis of quartz at an angle between 0° and 45° for the one surface wave resonator and at an angle greater than 45° for the other surface wave resonator.

67. The oscillator of claim 66, wherein types of crystal, crystalline section as well as spreading directions of the two-gate surface wave resonators for acoustic surface waves are selected so that temperature dependencies $f_1(T)$ and $f_2(T)$ of the synchronous frequencies $f_1$ and $f_2$ respectively of the first or second two-gate surface wave resonator satisfy the equation:

$$V(f_1(T), f_2(T)) = -(\partial_\Phi/\Phi f_2)/(\partial_p/\partial f_1)$$

with $$V = (df_1/dT)/(df_2/dT)|_{T=T_1}$$

or with $$V = [(f_{1,max} - f_{1,min})/\Delta T_1]/[(f_{2,max} - f_{2,min})/\Delta T_2]$$

and with $$\Delta T_{1,2} = T_{1,2,max} - T_{1,2,min}$$

$\Phi$ being a phase of the composite of the two-gate surface wave resonator resonators, $f_{1,2,max}$ being a maximum synchronous frequency of the first or the second two-gate surface wave resonators respectively in the temperature range under consideration, $f_{1,2,min}$ being a minimum synchronous frequency of the first and second two-gate surface wave resonators respectively in the temperature range under consideration and $T_{1,2,max}$ and $T_{1,2,min}$ being respective maximum and minimum temperatures at which the corresponding extreme values of the synchronous frequencies occur and $T_1$ being a temperature in the temperature range under consideration.

68. The oscillator of claim 66, wherein the temperature coefficient of the synchronous frequency of the same order dominates in both the surface wave resonators.

69. The oscillator of claim 66, wherein the temperature coefficient of the synchronous frequency of first order dominates in both the surface wave resonators.

70. The oscillator of claim 66, wherein the temperature coefficient of the synchronous frequency of second order dominates in both the surface wave resonators.

71. The oscillator of claim 66, wherein the temperature coefficient or first order of the synchronous frequency of each of the two surface wave resonators is not equal to zero and differs in algebraic sign from this temperature coefficient of the other surface wave resonator.

72. The oscillator of claim 66, wherein the temperature coefficient of second order of the synchronous frequency of each of the two surface wave resonators is not equal to zero and have a same algebraic sign, and the temperature coefficients of first order, in relation to a specified temperature, being equal to zero.

73. The oscillator or claim 66 wherein the surface wave resonators comprise a coupling converter as coupling element and the coupling converters of the first surface wave resonator are connected with the coupling converters of the respectively second surface wave resonator over two electrical connections.

74. The oscillator of claim 66, wherein the apertures of the coupling converters differ from one another and the number of teeth of the coupling converters are the same.

75. The oscillator of claim 66, wherein the number of teeth of the coupling converters differ from one another and the apertures of the coupling converters are the same.

76. The oscillator of claim 73, wherein an inductance coil is connected between the electrical connections which connect the coupling converters of different ones of the surface wave resonators.

77. The oscillator of claim 73, wherein a capacitance is connected between the electrical connections, which connect the coupling converters of different one of the surface wave resonators.

* * * * *